United States Patent
Fournier

(10) Patent No.: US 6,200,899 B1
(45) Date of Patent: Mar. 13, 2001

(54) METHOD OF CLEANING SEMICONDUCTOR WAFERS AFTER CMP PLANARIZATION

(75) Inventor: Bernard Fournier, Bretigny-sur-Orge (FR)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/282,130

(22) Filed: Mar. 31, 1999

(30) Foreign Application Priority Data

Apr. 30, 1998 (EP) ................................................ 94880029

(51) Int. Cl.$^7$ ................................................ H01L 21/302
(52) U.S. Cl. ............................................................ 438/693
(58) Field of Search ................................... 438/691, 692, 438/693, 745, 750, 754

(56) References Cited

U.S. PATENT DOCUMENTS 5,893,756 * 4/1999 Berman et al. ....................... 438/692
5,894,852 * 4/1999 Gonzales et al. ..................... 134/1.3
5,935,869 * 8/1999 Huynh et al. ......................... 438/692

* cited by examiner

Primary Examiner—David Nelms
Assistant Examiner—Quoc Hoang
(74) Attorney, Agent, or Firm—Jay H. Anderson

(57) ABSTRACT

The cleaning method of the present invention aims to remove polishing slurry residuals and metal particles remaining on the semiconductor wafer surface after chem-mech polishing a composite metal/dielectric structure for planarization purposes. The method is particularly well adapted when the metal is tungsten. In essence, it comprises the steps of brush scrubbing the wafer first with a stream of an alkaline colloidal silica slurry having a pH equal or greater than 10 for a short period of time, then with de-ionized water as standard. The cleaning step is performed after the polishing step and prior to the "touch-up" step. A standard rinsing/drying step terminates the chem-mech process step sequence.

15 Claims, 3 Drawing Sheets

METHOD OF CLEANING SEMICONDUCTOR WAFERS AFTER CMP PLANARIZATION

FIELD OF INVENTION

The present invention relates to the manufacture of integrated circuits (ICs) in semiconductor wafers and more particularly to a method of cleaning semiconductor wafers after chemical-mechanical polishing (CMP) planarization.

BACKGROUND OF THE INVENTION

Chemical-mechanical or chem-mech polishing (CMP) has recently become a key technology driver in the semiconductor industry. Chem-mech polishing is the preferred technique to achieve global wafer planarization for submicron advanced semiconductor integrated circuits at the personalization level. As a result of its strong anisotropic removal property, it is extensively used to date for the formation of the conductive interconnection scheme at the surface of semiconductor wafers (hereinbelow referred to as "wafers" for brevity). Forming said conductive interconnection scheme generally requires a refractory metal, such as tungsten (W), which is preferred because of its high conductivity and low corrodability.

Two types of tungsten structures are formed using the chem-mech polishing technique at this stage of the wafer planarization process. They must be distinguished depending on they are horizontal such as lands (for dual damascene and local interconnects) or vertical such as studs (for inter-level contact in the via-holes). However, the same sequence of processing steps can be used to form either type of structure.

For instance, using standard photolithographic and insulator plasma etch techniques, a recessed pattern (lines or openings) is first defined in a planarized dielectric layer. Then, a dual adhesion layer of titanium/titanium nitride forming a liner is deposited onto the wafer by sputtering. Next, a layer of tungsten is blanket deposited onto the wafer surface by Chemical Vapor Deposition (CVD) to fill the recessed pattern.

Finally, the wafer is chem-mech polished with an adequate slurry to remove the tungsten and titanium-titanium nitride materials in excess and to produce a planar semiconductor structure wherein the tungsten and the dielectric surfaces are coplanar. For instance, ferric nitrate/alumina slurries are commonly used to date in the semiconductor industry for that purpose. Alumina is the most commonly used abrasive for polishing tungsten because it is closer in hardness than any other material. Adhesion of particulate contaminants occurs as a result of the electrostatic attractive forces between particles (alumina, metals, ... ) and some of the wafer constituents (w, SiO2, ... ) during the polishing step properly said. The zeta potential is the parameter which usually provides a measure of these electrostatic forces between charged particles.

The CMP polishing step is generally continued by the so-called "touch-up" step with a specific slurry. Its main role is to terminate the polishing action of the previous CMP step, it also strips away some metallic residues left at the wafer surface that could subsequently reveal detrimental in the successive processing steps (e.g. to cause electrical shorts between conductive lands). However, this step has a limited cleaning effect. During this step, a very thin (50 nm) superficial film of the dielectric layer is etched, typically with an ammonium persulfate or an alkaline silica based slurry. The "touch-up" step is sometimes considered as optional, but in reality it is quite recommended.

At this stage of the tungsten chem-mech polishing process, an efficient cleaning procedure must necessarily follow. This cleaning, which will be referred to hereinbelow as the post-tungsten CMP cleaning, is essential to totally or at least substantially remove the slurry residuals and metal particles that still remain at the end of the chem-mech polishing/touch-up steps before the next processing step of the fabrication process is performed in order to avoid any potential source of contamination.

As a matter of fact, modern chem-mech polishing tools in-situ incorporate a so-called scrubbing device to eliminate this wafer particulate contamination. Scrubbing the wafer with Polyvinyl Alcohol (PVA) brushes and de-ionized (DI) water is the state-of-the-art technique to date to perform post-tungsten CMP cleaning. This simplified clean-up technique has been improved so far by the addition of chemicals (e.g. a surfactant, an acid, an alkaline ... ) to the de-ionized water in order to obtain a substantial removal of the slurry residuals and metal particles. A suitable choice of the cleaning chemistry is very important, because it controls the electrokinetic interactions in the wafer surface-brush-particle system and the particle detachment mechanism from both the wafer surface and the brush. An acid solution, e.g. hydrofluoric (HF) acid diluted in DI water (2:100 ratio) with a pH of about 2 or an alkaline solution, e.g. ammonium hydroxide (NH4OH) diluted in DI water (1:100 ratio) with a pH of about 10 are typical examples of cleaning chemistries used to date.

PVA brushes are compatible with such cleaning chemistries in the 2 to 12 pH range.

FIG. 1 summarizes the standard three-step tungsten chem-mech polishing process as described above, which bears numeral 10. As apparent in FIG. 1, the wafer is first chem-mech polished, typically with an alumina base slurry (box 11), then, the "touch-up" is performed with a different slurry (box 12), next, the wafer is cleaned by scrubbing with an alkaline or acid solution and finally dried (box 13). At the end of the CMP process, polished wafers are usually referred to as "W-CMP wafers".

Unfortunately, this standard CMP process described by reference to FIG. 1 that is performed for planarization purposes, is not totally satisfactory. It still remains an acute particulate contamination problem caused by slurry residuals and particles of the metals used in the conductive interconnect scheme that are left at the wafer surface at the end of the CMP process as a whole. For instance, when the conventional ferric nitrate/alumina based slurry is used, ferric nitrate, alumina and metallic particles (or aggregates) are commonly found at the wafer surface at this stage of the fabrication process at an unacceptable amount.

Recently, this acute problem of particulate contamination was addressed in an article of T. L. Myers, M. A. Fury and W. C. Krusell entitled: "Post-tungsten CMP cleaning: issues and solutions" published in Solid State Technology, October 1995". Still using conventional cleaning solutions similar to those mentioned above, these authors have thoroughly studied the role of the zeta potential which was considered as the determining parameter of any attempt in the particulate contamination reduction of W-CMP wafers. The following excerpt is illustrative in that regard:

"Zeta potential offers a viable explanation for the mechanisms observed in tungsten cleaning. The enhanced cleaning ability of alkaline (high pH) solutions arises from the strong relationship between the pH and zeta potentials of these solutions and other materials present in the cleaning environment. FIG. 2 illustrates zeta potential versus pH for alumina, silica, PVA, and tungsten. When the zeta potentials between the brushes, slurry, and wafer surface are all the same sign (either positive or negative), as in a typical oxide CMP process, it is easier for the particles to be removed from the wafer. Tungsten cleaning, which follows a low pH, alumina based CMP process, is more difficult because the zeta potential differences between materials have changed sign; the alumina particles of the slurry exist in a positive regime, in contrast with the rest of the wafer environment. This zeta potential dependence emphasizes the need to know what type of CMP process was used before the wafer is cleaned. Two different processes can produce very different levels of cleaning ability. For example, a tungsten CMP process followed by an oxide "touch-up" step produces a wafer surface similar to the standard oxide process. In contrast, a tungsten process followed by only a short buffing step, the wafer would require cleaning with the high pH chemical and an increased cleaning time in order to achieve better particle control."

According to the teachings of this article, it is recommended to use alkaline with a high pH range rather than an acid cleaning mixture to ensure that all the components involved in the cleaning (wafer, brushes, . . . ) are at the same zeta potential. But, because the "touch-up" step is performed after the CMP polishing step, the wafer still remains highly contaminated so that the cleaning step which just follows does not have the expected efficiency.

As a matter of fact, it thus appears that both the prior art cleaning chemistries and the step sequence depicted in FIG. 1 do not have the desired contamination effect reduction that is required to date to meet the drastic requirements of advanced semiconductor wafer fabrication specifications. Moreover, said prior art chemistries have other inconveniences. An acid solution not only attacks the slurry residuals but also attacks the liner causing there by damages to the wafer surface. On the other hand, cleaning with an ammonium hydroxide solution is known to degrade the surface of the mirror-polished wafers by performing an undesired pit etching thereof. However, ammonium hydroxide based solutions are by far the most commonly cleaning chemistries used to date to remove the slurry residuals and metal particles on the W-CMP wafer surface.

Finally, it is to be noted that in the standard CMP process depicted in FIG. 1, the cleaning step and the "touch-up" step employ totally different cleaning chemistries which is a further inconvenience.

SUMMARY OF THE PRESENT INVENTION

It is therefore a primary object of the present invention to provide a post-metal CMP cleaning method which totally removes all the slurry residuals and metal particles remaining on the wafer surface after the chem-mech polishing step without damaging it.

It is still another object of the present invention to provide a post-metal CMP cleaning method wherein the cleaning mixture has an adequate pH to ensure that all the components (wafer, brushes, particles, . . . ) involved in the cleaning are at the same zeta potential.

It is still another object of the present invention to provide a post-metal CMP cleaning method wherein the cleaning step is performed between the CMP step and the "touch-up" step.

It is still another further object of the present invention to provide a post-metal CMP cleaning method which uses the same chemistry for both the cleaning/scrubbing and "touch-up" steps.

The accomplishment of these and other related objects is achieved by the post-metal CMP cleaning method of the present invention that aims to totally or at least substantially remove the slurry residuals and metal particles remaining at the wafer surface after the chem-mech polishing step. According to a first significant feature of the present invention, the cleaning method includes the brush scrubbing of the wafer surface in a two-step process. The wafer is first scrubbed with an alkaline colloidal silica slurry for a short period of time, then with de-ionized water in the usual manner. The slurry has a pH equal or greater than 10 to ensure the same zeta potential between all the different components (wafer, brushes, . . . ) involved in this cleaning step. According to another significant feature of the present invention, the cleaning step is performed after the CMP polishing step and prior to the "touch-up" step. A standard rinsing/drying step terminates the CMP process step sequence. The present method is particularly well adapted to W-CMP wafers as defined above. The novel features believed to be characteristic of this invention are set forth in the appended claims. The invention itself, however, as well as these and other objects and advantages thereof, will be best understood by reference to the following detailed description of an illustrated preferred embodiment to be read in conjunction with the accompanying drawings.

DESCRIPTION OF A PREFERRED EMBODIMENT

Applicant's inventor has conducted different research works to identify any valuable alternative to the known cleaning chemistries described above in the BACKGROUND OF THE INVENTION section. Unexpectedly, alkaline colloidal silica slurries have demonstrated high efficiency when used for the cleaning/scrubbing step. These slurries have been extensively used so far for the polishing of various insulator materials, typically $SiO2$ (for instance, in the "touch-up" step), but not for the cleaning of contaminated wafers. It has also been found that pure (not diluted) colloidal silica slurries stabilized by an alkaline are the preferred cleaning mixtures. Ammonium hydroxide-stabilized and potassium hydroxide-stabilized colloidal silica slurries which are commercial products easily available on the shelf, have been selected for the following experiments.

Figure 1:
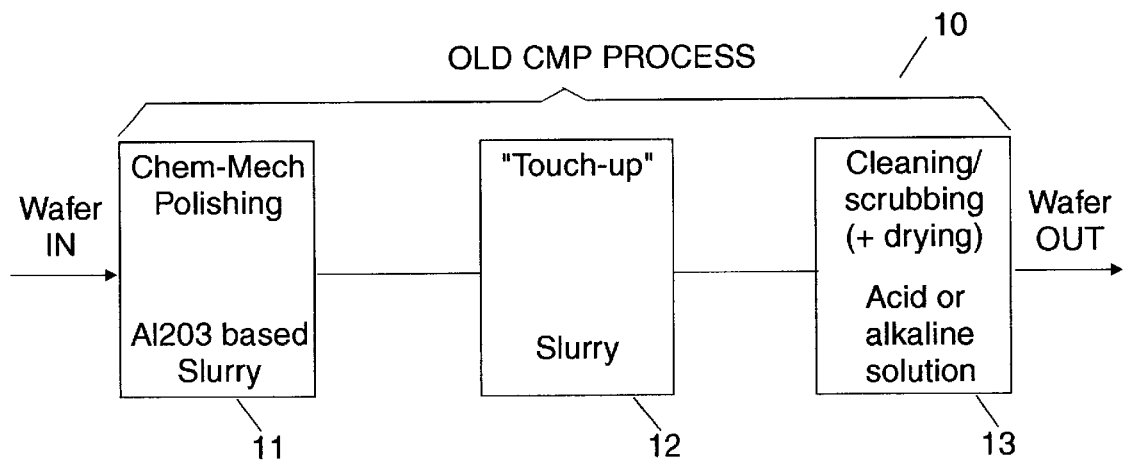
FIG. 1 illustrates the three basic steps of the state-of-the-art W-CMP process wherein the step of cleaning the W-CMP wafer is performed after the "touch-up" step and uses a standard cleaning chemistry, i.e. a diluted acid or an alkaline solution.
Figure 2:
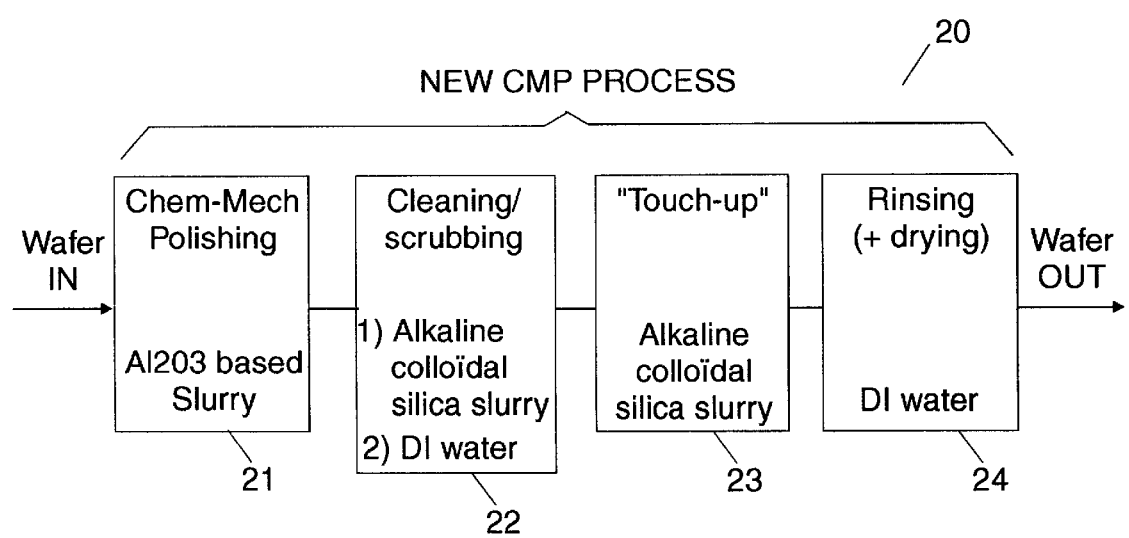
FIG. 2 illustrates the four basic steps of the W-CMP process according to the method of the present invention wherein the step of cleaning the W-CMP wafer is performed just after the CMP polishing step with a pure alkaline colloidal silica slurry.

On the other hand, Applicant's inventor has also discovered that performing the step of cleaning/scrubbing just after the CMP step had also some advantages. The new CMP process is schematically illustrated in FIG. 2. Turning to FIG. 2, the new CMP process 20 includes four steps. The wafer is chem-mech polished as standard (box 21). Next, it is cleaned by scrubbing successively in an alkaline colloidal silica slurry for a short time, then in DI water (box 22) according to an essential feature of the method of the present invention. The process continues with the standard "touch-up" which is preferably performed with the same slurry (box 23). Finally, the wafer is rinsed in DI water and dried (box 24).

EXPERIMENTS

The experiments have been conducted with a polisher tool provided with an integrated scrubber such as model EPO-222 sold by EBARA Corp., Fujisawa, Japan, The EPO-222 polisher has two polishing-cleaning stations, referred to hereinbelow as STATION 1 and STATION 2. A PANW pad manufactured by FREUDENBERG, Chelmsford, Mass., USA was mounted on the polish platen substantially in the plane of wafers. The polishing slurry consisted of 10 gr of alumina ($Al_2O_3$) powder and 80 gr of ferric nitrate ($Fe_2(NO_3)_3$) diluted in 1 liter of de-ionized (DI) water. The wafers were then rinsed in the pusher station of the polisher tool by DI water during 30 s as standard.

Typical polishing parameters are:

Table speed: 50 rpm

Carrier speed: 50 rpm

Polish pressure: 200000 Pa

Pad Temp.: 20° C.

Slurry flow: 150 cc/min

Next, the wafers were sent individually through the brush module and the spin rinse/dry module of the polisher tool in sequence for cleaning. The brush module consists of a scrubber with PVA brushes that cleans both wafer surfaces simultaneously. The spin rinse/dry module is equipped with a PVA sponge that is fitted up on a pencil. The wafer is cleaned with the sponge filled with DI water by a sweeping movement of the pencil. Experiments were conducted with two different KLEBOSOL slurries, manufactured by HOECHST, Cuise-Lamotte, France. These products are concentrated aqueous suspensions of non-agglomerated silica particles. They are generally obtained by the in-situ growth of silica crystal nuclei, not by the redispersion of previously formed particles. Finally, the wafer is dried by centrifugation as standard.

A standard cleaning of the wafer surface is performed in STATION 1 with pure de-ionized water on the double side scrubber. In STATION 2, the cleaning is performed with the cleaning chemistry according to the method of the present invention. The alkaline stabilized colloidal silica slurry is injected for 3 s when scrubbing starts, then the scrubbing is continued for 90 s with DI water as standard. TABLE I below summarizes the key parameters of the cleaning step for both stations.

TABLE I

| DOUBLE SCRUBBER MODULE | STATION 1 | STATION 2 | |
|---|---|---|---|
| cleaning process | standard | with slurry step | |
| Nb of process steps | 1 | 2 | |
| Cleaning time (s) | 90 | 3 | 90 |
| Wafer rotation (rpm) | 120 | 120 | 120 |
| brushes rotation (rpm) | 180 | 180 | 180 |
| cleaning mixture | DI water | slurry | DI water |
| slurry flow (cm3/min) | — | 500 | — |
| DI water | 1500 | — | 1500 |

EXAMPLE I

A first experiment was conducted with the KLEBOSOL 20N50 slurry which has a high pH (pH=10) and is ammonium hydroxide stabilized. TABLE II below summarizes the contamination evolution for 1120 wafers processed on each station with sampling of one monitor wafer by station every 100–120 processed wafers. Light point defects (LPDs) greater than 0.3 $\mu$m on all monitor wafers were measured using a TENCOR 6420 measurement tool manufactured by TENCOR, Santa-Clara, Calif., USA. A total of 11 monitor wafers were collected, they are referenced below by their rank (ID# number).

TABLE II

| wafer ID# | STATION 1<br>DI water<br>Nb of LPDs | STATION 2<br>slurry<br>Nb of LPDs |
|---|---|---|
| 1 | 11 | 17 |
| 110 | 240 | 171 |
| 230 | 288 | 382 |
| 340 | 2999 | 207 |
| 460 | 920 | 522 |
| 570 | 1170 | 416 |
| 690 | 1474 | 287 |
| 800 | 6035 | 131 |
| 920 | 1931 | 129 |
| 1050 | 2175 | 164 |
| 1120 | 2027 | 286 |

As apparent from TABLE II, the average number of LPDs is 1752 for wafers processed in STATION 1 while it is equal to 246 in STATION 2 when the slurry of the present invention is used, i.e. the new process reduce the contamination level by a factor of about 7 (1752/246).

Figure 3A:
FIGS. 3A and 3B are graphs which respectively show the Light Point Defects (LPDs) distribution at the wafer surface for 1120 processed wafers with sampling a monitor wafer every 100–120 wafers when the wafer are cleaned with de-ionized water and with an alkaline colloidal silica slurry (KLEBOSOL 20N50) according to the method of the present invention.
Figure 3B:
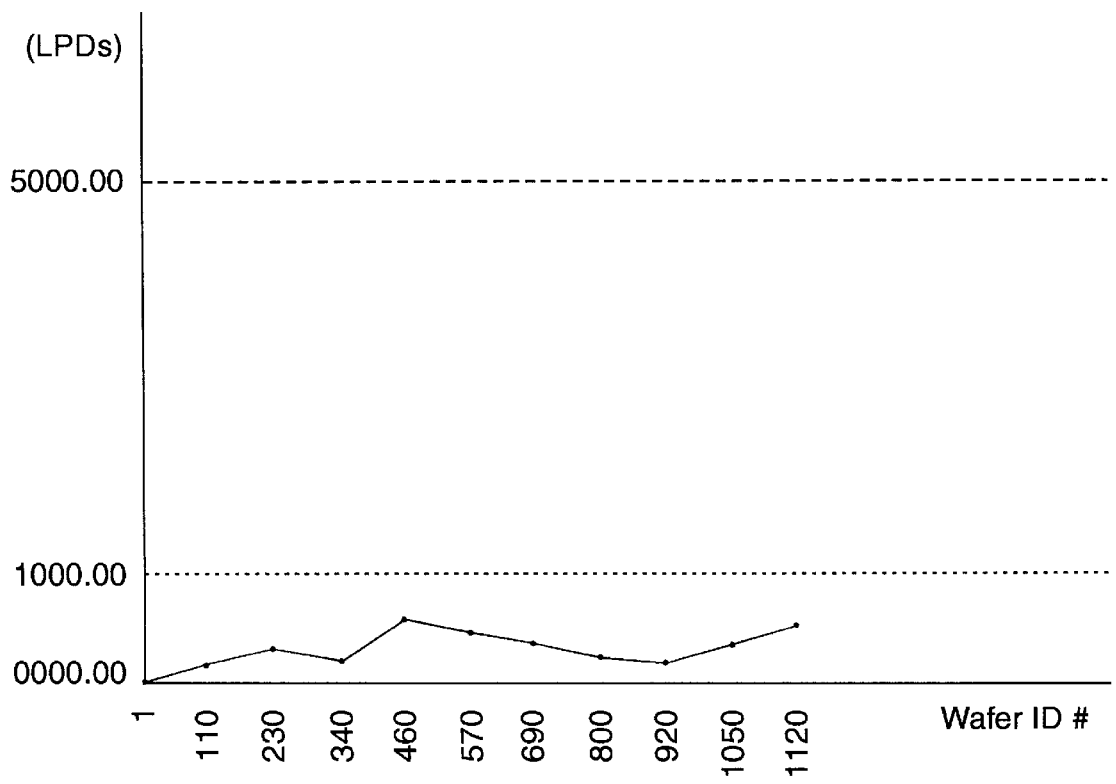

FIGS. 3A and 3B respectively show at a glance the Light Points Defects (LPDs) distribution when chem-mech polished wafers are cleaned with DI water and with the KLEBOSOL 20N50 slurry according to the method of the present invention.

After these 1120 wafers were processed, it was noticed that the PVA brushes were soiled by ferric nitrate contamination when the standard cleaning step with DI water was used. On the contrary, no significant contamination of the PVA brushes was found when the cleaning step was performed with the alkaline colloidal silica slurry. The nature of this residual metallic contamination was analyzed on three silicon blanket wafers by the TXRF technique (this acronym designates the "total reflection X-ray fluorescence" and is usually performed with an adequate spectrometer). The first blanket wafer was used as the reference wafer, the second was cleaned in STATION 1 with pure DI water while the third blanket wafer was cleaned in STATION 2 with the KLEBOSOL 20N50 slurry. The results are listed in TABLE III below.

TABLE III

| | (TXRF × 10E10 atoms/cm2) | | | | | | | | |
|---|---|---|---|---|---|---|---|---|---|
| | K | Ca | Ti | Cr | Mn | Fe | Ni | Cu | Zn |
| blanket wafer (reference) | <13 | <12 | <7 | <5 | <4 | <3 | <3 | <3 | <2 |
| standard clean (DI water) | <13 | <12 | 16 | <5 | <4 | 32 | <3 | <3 | 2 |
| new clean (20N50) | <13 | <12 | <7 | <5 | <4 | 8.7 | <3 | <3 | <2 |

In addition to the LPD reduction mentioned above by reference to TABLE II, the TXRF analysis results also show a drastic reduction of the metal contaminant concentration with the new cleaning process. There is none added contamination for titanium and the ferric contamination although higher than in the reference wafer has been significantly reduced (8.7 vs 32).

EXAMPLE II

A new evaluation was performed with another KLEBOSOL slurry labeled PL1501 still manufactured by HOECHST. Likewise, it is a slurry with high pH (pH=10) but stabilized with potassium hydroxide. After one month production, the contamination level evolution was similar to the results obtained in EXAMPLE I. TABLE IV below summarizes the LPDs distribution now for 1040 wafers processed on each station still with a sampling of one monitor wafer every 80–100 wafers per station.

TABLE IV

| wafer ID# | STATION 1<br>DI water<br>Nb of LPDs | STATION 2<br>slurry<br>Nb of LPDs |
|---|---|---|
| 1 | 22 | 12 |
| 80 | 12 | 204 |
| 160 | 240 | 277 |
| 240 | 288 | 307 |
| 320 | 2990 | 253 |
| 400 | 920 | 314 |
| 480 | 1170 | 390 |
| 560 | 1474 | 188 |
| 640 | 6035 | 479 |
| 720 | 2639 | 201 |
| 800 | 1931 | 262 |
| 880 | 2175 | 190 |
| 1040 | 1393 | 139 |

Now, the average number of LPDs decreases from 1637 to 247, i.e. still by a factor of about 7.

Figure 4A:
FIGS. 4A and 4B are graphs which respectively show the Light Point Defects (LPDs) distribution at the wafer surface for 1040 processed wafers with sampling a monitor wafer every 80–100 wafers when the wafer are cleaned with de-ionized water and with an alkaline colloidal silica slurry (KLEBOSOL PL1501) still according to the method of the present invention.
Figure 4B:
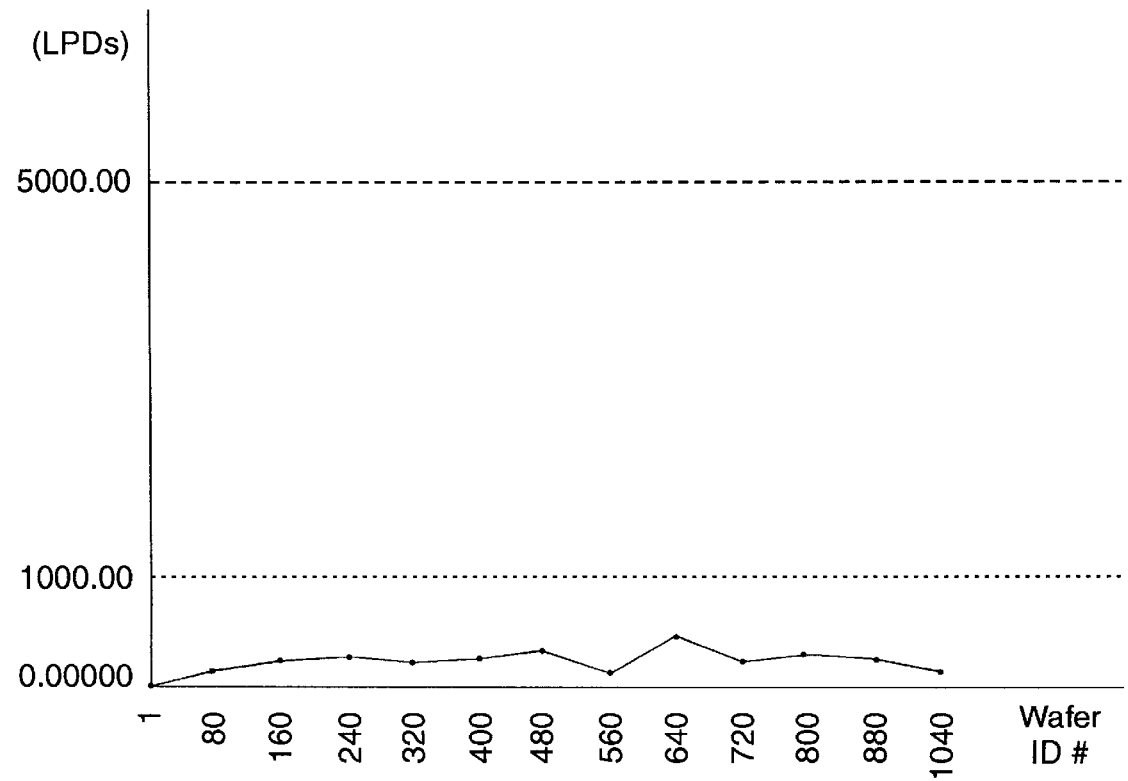

FIGS. 4A and 4B respectively show at a glance the Light Points Defects (LPDs) distribution when chem-mech polished wafers are cleaned with DI water and with the KLEBOSOL PL1501 slurry still according to the method of the present invention.

The residual metallic contamination was analyzed on three blanket silicon wafers by the TXRF technique according to the same procedure as described above.

TABLE V

| | (TXRF × 10E10 atoms/cm2) | | | | | | | | |
|---|---|---|---|---|---|---|---|---|---|
| | K | Ca | Ti | Cr | Mn | Fe | Ni | Cu | Zn |
| blanket wafer (reference) | <13 | <12 | <7 | <5 | <4 | <3 | <3 | <3 | <2 |
| standard clean (DI water) | <13 | <12 | 29 | <5 | <4 | 39 | <3 | <3 | <2 |
| new clean (PL1501) | <13 | <12 | <7 | <5 | <4 | 18 | <3 | <3 | <2 |

The results obtained by the TXRF analysis show a still effective reduction of the metal contaminant concentration but less important than obtained with the previous slurry which was stabilized with ammonium hydroxide. In fact, the ammonium hydroxide stabilizer appears to be a more effective contributor than the potassium hydroxide to the disclosed improvement.

It is to be noted that in addition to the effective particulate contamination reduction pointed out above, the use of the same slurry in the "touch-up" and in the cleaning/scrubbing steps has the advantage of greater standardization and better process integration. Moreover, the alkaline colloidal silica slurry has not the inconveniences of the acid or alkaline diluted solutions recited above, because it is not aggressive for the silicon and other materials such as SiO2 as well.

What is claimed is:

1. A method of cleaning semiconductor wafers to remove polishing slurry residuals and metal particles remaining on the semiconductor wafer surface after chem-mech polishing a composite metal/dielectric structure for planarization purposes, the method comprising the steps of:

a) after said chem-mech polishing, brush scrubbing the polished surface of the wafer with an alkaline colloidal silica slurry having a pH equal to or greater than 10 for a short period of time; and b) afterwards brush scrubbing the wafer with de-ionized water.

2. The method of claim 1 wherein said alkaline colloidal silica slurry is stabilized by ammonium hydroxide.

3. The method of claim 1 wherein said alkaline colloidal silica slurry is stabilized by potassium hydroxide.

4. The method of claim 1 wherein said scrubbing is performed with polyvinyl alcohol (PVA) brushes.

5. The method of claim 1 wherein said short period of time is equal to about 3 s.

6. A process for manufacturing a semiconductor integrated circuit comprising the steps of:

a) providing a semiconductor structure having a dielectric layer provided with metal lines formed thereupon;

b) planarizing said structure by a chem-mech polishing step with an abrasive slurry to produce a planar semiconductor structure wherein the metal and dielectric surfaces are coplanar; and c) after said planarizing step, brush scrubbing the wafer surface with first a stream of an alkaline colloidal silica slurry having a pH equal to or greater than 10 for a short period of time and then with a stream of de-ionized water to eliminate both polishing slurry residuals and metal particles forming contaminants remaining bound to the wafer surface.

7. The method of claim 6 wherein said alkaline colloidal silica slurry is stabilized by ammonium hydroxide.

8. The method of claim 6 wherein said alkaline colloidal silica slurry is stabilized by potassium hydroxide.

9. The method of claim 6 wherein said scrubbing is performed with polyvinyl alcohol (PVA) brushes.

10. The method of claim 6 wherein said short period of time is equal to about 3 s.

11. In a process for manufacturing a semiconductor integrated circuit, a chem-mech polishing process comprising the steps of:
   a) providing a semiconductor structure having a dielectric layer provided with metal lines formed thereupon;
   b) planarizing said structure by a chem-mech polishing step with an abrasive slurry to produce a planar semiconductor structure wherein the metal and dielectric surfaces are coplanar;
   c) after said planarizing step, brush scrubbing the wafer surface with first a stream of an alkaline colloidal silica slurry having a pH equal to or greater than 10 for a short period of time, and then with a stream of de-ionized water;
   d) afterwards performing a touch-up step, characterized as an additional chem-mech polishing step, using the same slurry as in step c); and
   e) rinsing the wafer with de-ionized water and finally drying the wafer;
   whereby both polishing slurry residuals and metal particles forming contaminants remaining bound to the wafer surface are substantially eliminated.

12. The method of claim 11 wherein said alkaline colloidal silica slurry is stabilized by ammonium hydroxide.

13. The method of claim 11 wherein said alkaline colloidal silica slurry is stabilized by potassium hydroxide.

14. The method of claim 11 wherein said scrubbing is performed with polyvinyl alcohol (PVA) brushes.

15. The method of claim 11 wherein said short period of time is equal to about 3 s.

* * * * *